United States Patent [19]

Mase et al.

[11] Patent Number: 4,728,627
[45] Date of Patent: Mar. 1, 1988

[54] METHOD OF MAKING MULTILAYERED INTERCONNECTS USING HILLOCK STUDS FORMED BY SINTERING

[75] Inventors: Yasukazu Mase, Tokyo; Masahiro Abe, Yokohama; Masaharu Aoyama, Fujisawa, all of Japan

[73] Assignee: Kabushiki Kaisha Toshiba, Kawasaki, Japan

[21] Appl. No.: 870,117

[22] Filed: Jun. 3, 1986

[30] Foreign Application Priority Data

Jun. 6, 1985 [JP] Japan .................. 60-123002

[51] Int. Cl.⁴ .................. H01L 21/28; H01L 21/302
[52] U.S. Cl. .................. 437/190; 437/189; 437/195; 437/196; 437/200; 437/201
[58] Field of Search .................. 29/590, 591, 577 C; 148/1.5, DIG. 8, DIG. 3, DIG. 50; 437/189 (U.S. only), 190 (U.S. only), 195 (U.S. only), 196 (U.S. only), 200 (U.S. only), 201 (U.S. only)

[56] References Cited

U.S. PATENT DOCUMENTS 4,462,149  7/1984  Schwabe .................. 29/591

OTHER PUBLICATIONS

Japanese Patent Disclosure (Kokai) No. 59-107539; N. Ohwada et al. disclosed on Jun. 21, 1984.
Japanese Patent Disclosure (Kokai) No. 60-105255, Y. Takamatsu et al. disclosed on Jun. 10, 1985.
Japanese Patent Disclosure (Kokai) No. 60-147137, Z. Morichika disclosed on Aug. 3, 1985.
Ghandhi, S. K. "VLSI Fabrication Principles", 1983, pp. 446-449.

Primary Examiner—Brian E. Hearn
Assistant Examiner—Kevin McAndrews
Attorney, Agent, or Firm—Finnegan, Henderson, Farabow, Garrett & Dunner

[57] ABSTRACT

A method of manufacturing a semiconductor device comprising the steps of preparing a semiconductor substrate on which a first insulation film is formed, forming a first conductive layer on the first insulation film, forming a hillock of the first conductive layer, forming a second insulation film on the structure, removing that portion of the second insulation film, in self-align with the hillock, which is on the hillock, thereby forming a contact hole leading to the first conductive layer, and forming on the structure a second conductive layer extending into the contact hole and contacting the first conductive layer.

13 Claims, 19 Drawing Figures

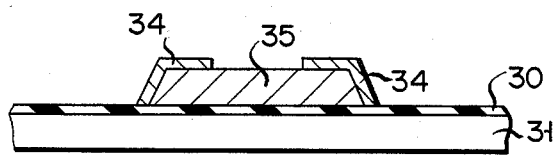
F I G. 4B
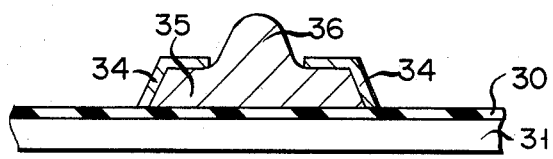
F I G. 4C
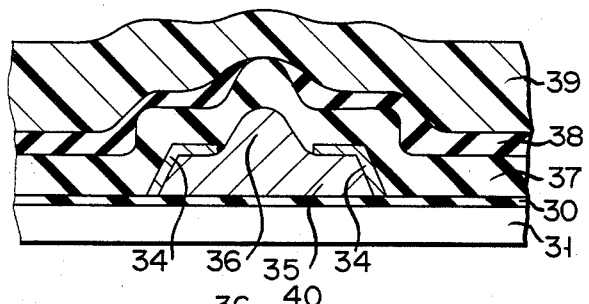
F I G. 4D
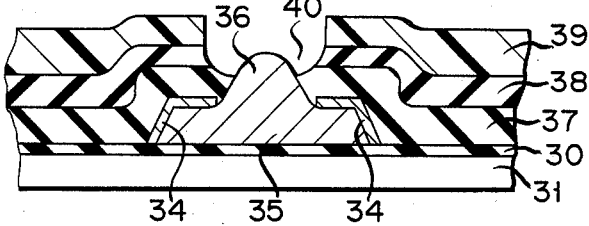
F I G. 4E
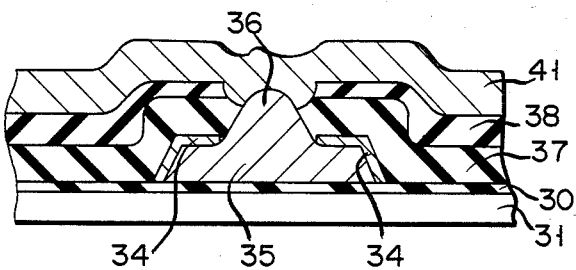
F I G. 4F

METHOD OF MAKING MULTILAYERED INTERCONNECTS USING HILLOCK STUDS FORMED BY SINTERING

BACKGROUND OF THE INVENTION

This invention relates to a method of manufacturing semiconductor devices, and more particularly to an improved method of forming multi-layered conductive structure semiconductor devices.

In semiconductor memory devices, attempts have been made to reduce the pattern size. This is due to the requirement of improving integration density to improve the operating speed of the integrated circuit. Particularly, in a semiconductor device of the multi-layered conductive structure type, further reduction has been made to the width of each conductive layer and to the interval between adjacent conductive layers. This trend has tended to reduce through hole sizes. It is for this reason that the RIE (reactive ion etching) process has been employed for forming through-holes. The RIE process is characterized by a small amount of side etching and also high etching controllability.

The conventional method of manufacturing a double conductive layer structure semiconductor device will be described by referring to FIGS. 1A through 1D. The following manufacturing method includes the step of forming through-holes.

FIG. 1A

First conductive layer 12 made of Al-Si and with thickness of 1.0 μm is formed on semiconductor substrate 11 having silicon oxide film 10 formed on the surface by thermal oxidation. Then, SiN film 13 is formed on the structure by the plasma process. This film will be referred to as a P-SiN film.

FIG. 1B

To flatten the surface, the substrate is coated with silica solution. Then, it is thermally processed. As a result, silica insulating film 14 is formed with a thickness of 0.4 μm.

FIG. 1C

A photoresist film is formed on the structure. Then, it is patterned by the photolithography process, to form patterned photoresist film 15. Using this photoresist film 15, silica insulating film 14 and P-SiN film 13 are selectively etched by the RIE process, to form through-hole 16.

FIG. 1D

Subsequently, resist film 15 is removed by the $O_2$ plasma process. Al-Si is deposited on the structure by the ordinary sputtering process. The deposition is continued up to 1.0 μm in thickness. Then, it is patterned to form second conductive layer 17.

In this way, the semiconductor device of the double conductive layer structure type is formed. The above manufacturing method, however, has the disadvantages as given below.

(1) It is preferable to taper the side walls of P-SiN film 13 and silica insulating film 14 at about 45° to 55° so that that portion 17' of the second conductive layer 17 which is on through-hole 16 is made thick. However, in the conventional method, the taper is steep, at about 65° to 75°. Such a steep taper results from constraints such as the selectivity of resist film 15 to P-SiN film 13, the etching rate of P-SiN film 13, and the stability of the etching. For this reason, the portion 17' of second conductive layer 17 is thinner than that portion of the second conductive layer 17 which is on the major surface of P-SiN film 13. The thickness of the conductive layer portion 17' is at most 20 to 40% of that of the thin portion of the conductive layer 17. At the thin portion, current density is high and therefore disconnection tends to occur.

(2) When the thickness of the interlayer insulating film made up of P-SiN film 13 and silica insulating film 14 is 1.0 μm or more, the variation in the etching dimension due to the recession of the photoresist film 15 is large. For example, in the case of the interlayer insulating film of 1.0 μm in thickness, the etching dimension varies to approximately 0.5 μm at one side. This fact makes it difficult to reduce the size of the through-hole. If before the etching process of the interlayer insulating film, the opening width of the through-hole of the photoresist film 15, which serves as the mask, is 2 μm, for example, the through-hole formed in the interlayer insulating film after the etching process has an opening width of a maximum of 3 μm as shown in FIG. 3. in FIG. 3, L1 designates the opening width of the through-hole of P-SiN film 13 which is defined by the combination of silica insulating film 14 and P-SiN film 13 after the etching processing. L2 represents the opening width of the through-hole at photoresist film 15.

SUMMARY OF THE INVENTION

Accordingly, an object of this invention is to provide a method of manufacturing semiconductor devices which is free from thinning or disconnection of the conductive layer.

According to the invention, there is provided a method of manufacturing a semiconductor device comprising the steps of:

preparing a semiconductor substrate on which a first insulation film is formed;

forming a first metal layer on the first insulation film;

forming a hillock of the first conductive layer;

forming a second insulation film on the structure;

removing that portion of the second insulation film, in self-alignment with the hillock, which is on the hillock, thereby forming a contact hole leading to the hillock; and forming on the structure a second conductive layer extending into the contact hole and contacting the hillock.

According to the invention, there is further provided a method of manufacturing a semiconductor device comprising the steps of:

preparing a semiconductor substrate on which a first insulation film is formed;

forming a first metal layer on the first insulation film;

forming on the first metal layer a second insulation film having a hillock-supressing function;

forming a third insulation film on the second insulation film;

forming a hole in the second and third insulation films;

forming a hillock of the first metal layer, which extends into the hole formed in the second and third insulation films, by thermally heating the structure; and forming on the structure a second metal layer extending into the hole and contacting the hillock.

BRIEF DESCRIPTION OF THE DRAWINGS

FIGS. 4A through 4F show cross sections of structures of a semiconductor device at various steps in a manufacturing method according to an embodiment of the present invention;

DETAIL DESCRIPTION OF THE PREFERRED EMBODIMENTS

Figure 1A:
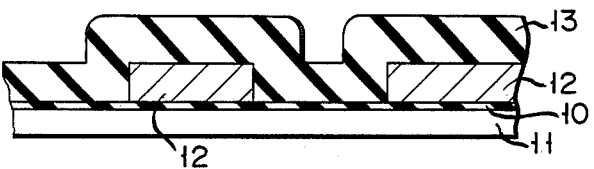
FIGS. 1A to 1D show cross sections of structures of a semiconductor device at various steps in a prior manufacturing method.
Figure 1B:
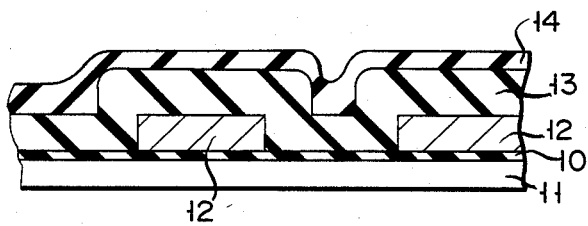
Figure 1C:
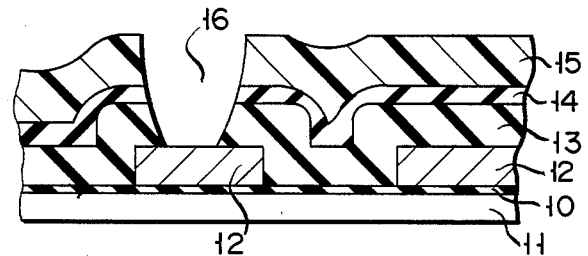
Figure 1D:
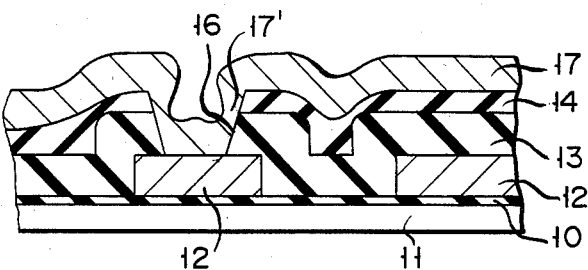
Figure 2:
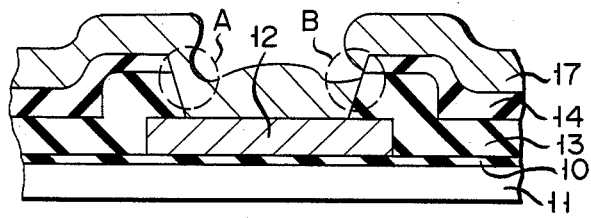
FIGS. 2 and 3 show cross sections of prior semiconductor devices of two conductive layer structure, respectively.
Figure 3:
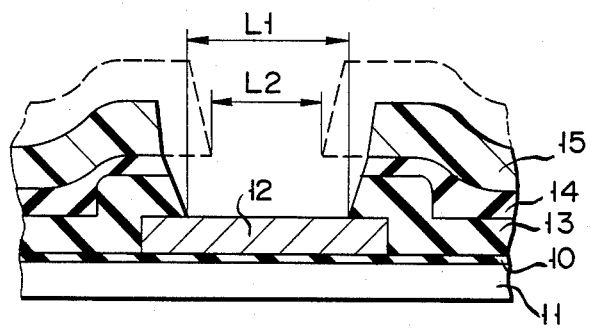
Figure 4A:
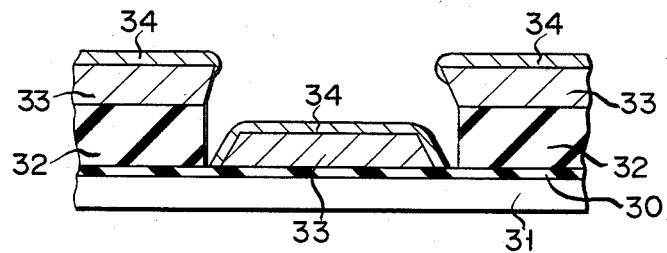

A method of manufacturing semiconductor devices, according to the first embodiment of this invention, will be described with reference to FIGS. 4A through 4F.

FIG. 4A

Silicon substrate 31 is a semiconductor substrate on which silicon oxide film 30 as a first insulation film has been formed by thermal oxidation. Polyimide is applied to the top silicon subtrate 31, then heat-treated to make a 1.3 μm thick lift-off layer of polyimide film 32. After that, polyimide film 32 is patterned by normal photolithography and RIE processes. Then the photoresist film (not shown) which was used as a mask when the polyimide film was patterned is removed. Using the normal sputtering process, a 1.0 μm thick Al-Si film 33, and a 0.1 μm thick Ti-Si2 film 34 are sequentially formed.

FIG. 4B

Using the $O_2$ ashing method, polyimide film 32 is lifted off, to remove the films of Al-Si 33 and Ti-Si2 34 formed on polyimide film 32. As a result, only the films 33 and 34 as directly formed on silicon oxide film 30 are left. The Al-Si film 33 on the film 30 will be referred to as a first conductive layer, and renumbered as 35, for simplicity. Further, by using the normal photolithography and RIE processes, the predetermined regions are removed, to form through-holes.

FIG. 4C

The photoresist film (not shown), which was used as the mask in removing the predetermined regions of film 34, is removed. The device is heated at 500° C. for 15 minutes to sinter first conductive layer 35, and to form hillock 36 of about 1.0 μm in height on the surface of first conductive layer 35, which is exposed to the through-hole.

FIG. 4D

A 1.0 μm thick P-SiN thick 37 is formed on the structure by the plasma method. The structure is coated with silica solution, and thermally treated, to form silica insulation film 38 of 0.4 μm in thickness. Then, photoresist is coated on silica insulation film 38 to form photoresist film 39 of 2.5 μm in thickness. The P-SiN film 37 and silica insulating film 38 constitute the second insulation film.

FIG. 4E

The photoresist film 39 is etched back by the $O_2$ RIE processing. In the $O_2$ RIE process, the $O_2$ amount is 60 sccm, pressure 3 Pa, and the power 550 W. By this etching, silica insulation film 38 and P-SiN film 37 above and on hillock 36 are removed. Further, silica insulating film 38 and P-SiN film 37 are successively etched away to form through-hole 40. The through-hole 40 corresponds to hillock 36 in a self-aligned manner and exposes hillock 36. In this case, photoresist film 39 is used as a mask. The RIE process is used for the etching. The etching conditions for silica insulating film 38 are: The gas flow rate, $CF_4/H_2 = 30/10$ sccm, pressure 2 Pa, and the power is 400 W. The etching conditions for the P-SiN film 37 are: The gas flow rate, $SF_6 = 100$ sccm, pressure 10 Pa, and the power is 500 W.

FIG. 4F

After the removal of photoresist film 39, the ordinary sputtering process is employed to form an Al-Si film (not shown) of 1.0 μm in thickness on the structure. This film is patterned by the ordinary photolithography and the wet etching method. Through the patterning, a patterned Al-Si film 4, is formed, serving as a second conductive layer.

The method of manufacturing the semiconductor of the double conductive layer type according to the first embodiment of this invention is performed in the abovementioned way.

As described above, according to the manufacturing method of this invention, hillock 36 is formed at the location where through-hole 36 is formed, by using the mask layer capable of limiting the hillock formation. Then, the interlayer film made up of P-SiN film 37 and silica insulation film 38 is formed. To remove the interlayer insulation films 37 and 38 in a self-aligned manner, through-hole 40 is formed, providing a good coverage with the second conductive layer 41 to be subsequently formed.

The manufacturing method of this invention as described has the following useful results.

(1) Hillock 36 of first conductive layer 35 is formed in through-hole 40 and thus the thickness of first conductive layer 35 is substantially increased. Therefore, the distance by which second conductive layer 41 extends into through-hole 40 in order to electrically connect to first conductive layer 35 is reduced. The coverage with second conductive layer 41 is considerably improved. Thus, the contact area between first and second conductive layers 35 and 41 is 1.5 to 4 times that of prior semiconductor devices, when the through-holes have the same opening width. Therefore, the operating current is distributed in this contact area at a low current density, thereby protecting against an open circuit.

(2) In forming through-hole 40, no tapering is required at the side walls of interlayer insulation films 37 and 38. Further, the TiSi2 film as the hillock limiting film of about 0.1 μm is thin. Therefore, the size conversion difference in etching of TiSi2 film is small, approximately 0.05 μm (one side). Therefore, the size reduction of the through-hole can easily be made.

Figure 5:
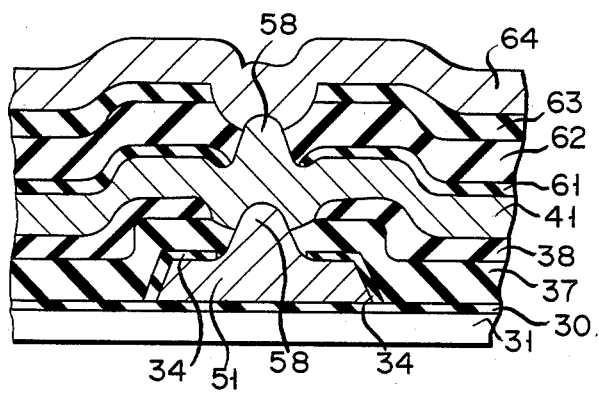
FIG. 5 shows a cross section of a semiconductor device of three conductive layer structure manufactured by a method of the present invention.
Figure 6:
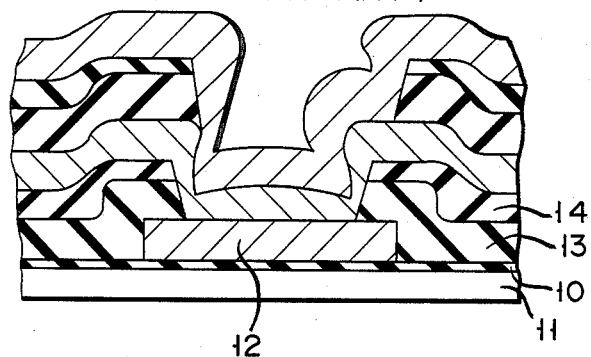
FIG. 6 shows a cross section of a semiconductor device of three conductive layer structure manufactured by a conventional method.

(3) The depth of through-hole 40 is smaller than the thickness of the films 37 and 38. Therefore, even in such a case that two through-holes are aligned in manufacturing a semiconductor device of three conductive layer type, as shown in FIG. 5, there is only a small possibility that the third conductive layer will be thinned or disconnected at the side walls of the through-hole. In FIG. 5, reference numeral 61 designates a Ti-Si$_2$ film, 62 a P-SiN film, 63 a silica insulation film, and 64 a third conductive layer. Incidentally, in the above case, a disconnection tends to occur if the device is manufactured according to the conventional method.

(4) No hillock is formed in other places than the through-hole. Therefore, no short circuiting occurs between the conductive layers. When an unnecessary hillock is formed, such short circuiting frequently occurs.

While in the above-mentioned embodiment, the TiSi$_2$ film is used for the hillock formation restricting film, it may be a metal film or metal compound film having the hillock formation restricting effect. The sintering employed for hillock formation in the embodiment as mentioned above was for forming the great hillock. It may, of course, be replaced by any other appropriate process, if necessary.

A second embodiment of a method of manufacturing semiconductor devices according to this invention will be described referring to FIGS. 7A to 7E.

FIG. 7A

Figure 7A:
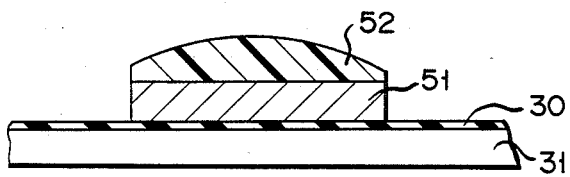
FIGS. 7A through 7E show cross sections of structures of a semiconductor device at various steps in a manufacturing method according to another embodiment of the present invention.
Figure 7B:
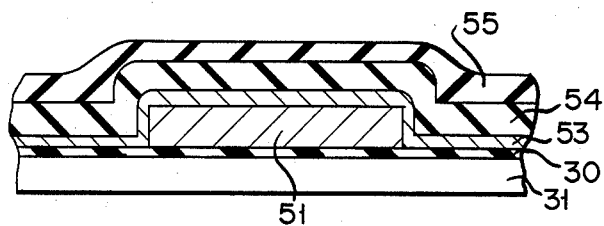
Figure 7C:
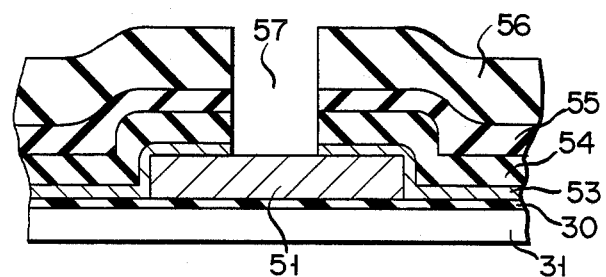
Figure 7D:
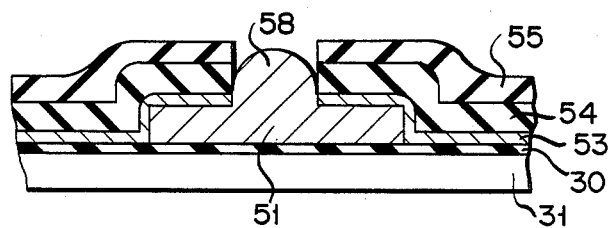
Figure 7E:
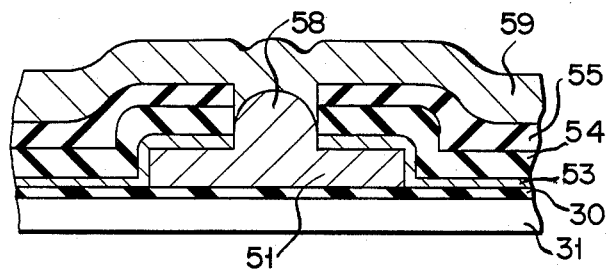

Silicon substrate 31 is provided as a semiconductor substrate having silicon oxide film 30 formed on the surface by the thermal oxidation process. After forming a 1.0 μm thick Al-Si film on silicon oxide film 30 by the usual sputtering process, the predetermined patterning is applied to the structure by the photolithography and RIE processes, thereby forming Al-Si film 51 as a first conductive layer. In FIG. 7A, reference numeral 52 designates a photoresist film as used as a mask in forming Al-Si film 51.

FIG. 7B

In the next step, following removal of photoresist film 52, a 0.1 μm thick P-SiN film 53 is formed by the plasma CVD process at temperature capable of preventing the hillock formation (e.g. 300° C.). The film 53 serves as a second insulation film. At a temperature of 380° C., P-SiN film 54 of 0.9 μm in thickness is formed. The formation of this film is made for securing a satisfactory insulation voltage tolerance, and for providing a good coverage on the step of first conductive layer 51. To smooth the stepped portions of the first conductive layer 51, silica solution is applied over P-SiN film 54. Then, it is subjected to thermal treatment, thereby to obtain a 0.4 μm thick silica insulation film 55.

FIG. 7C

Photoresist film 56 with a predetermined pattern is formed on silica insulation film 55 by the normal photolithography process. Under the same conditions as in the previous embodiment, using the RIE method, silica insulation film 55, and P-SiN films 54 and 53 are successively etched, with a mask of the photoresist film 56. Through this etching process, through-hole 57 connecting to the first conductive layer 51 is formed at a predetermined location on the conductive layer 51.

FIG. 7D

The photoresist film 56 is removed by the O$_2$ ashing process. Then, the device is thermally treated at 500° C. for 15 minutes. Through this thermal treatment, hillock 58 of about 1.0 μm in thickness is formed on the first conducted layer 51 exposed to the through-hole 57.

FIG. 7E

Further, second conductive layer 59 made of Al-Si and with a predetermined pattern, in contact with hillock 58 through through-hole 57, is formed on the silica insulation film 55.

In this way, the semiconductor device of the double conductive layer type was manufactured by the manufacturing method according to the second embodiment.

This embodiment can also attain the useful effects comparable with those of the first embodiment.

In this embodiment, the P-SiN film 53 was formed to 0.1 μm in thickness at 300° C. or less. Its thickness may be any value above 0.05 μm for restricting the hillock formation. The conditions of 500° C. and 15-minutes thermal treatment were used for hillock formation. Alternatively, the hillock is placed at less than 500° C., and this is repeated.

Al-Si for both the first and second conductive layers may be replaced by Al or Al alloy. Further, this invention is applicable not only to the double layered connection of the first and second conductive layers, but also to the connection of three or more layers.

As seen from the foregoing description, this invention can provide a manufacturing method for highly reliable semiconductor devices by allowing the formation of minute through-holes, and is free from thinning of the conductive layers or their disconnection at the through-holes.

What is claimed is:

1. A method of manufacturing a semiconductor device the steps of:
    preparing a semiconductor substrate on which a first insulation film is formed;
    forming a first metal layer on said first insulation film;
    forming a hillock of said first metal layer;
    forming a second insulation film on said first metal layer;
    removing that portion of said second insulation film, in self-alignment with said hillock, which is on said hillock, thereby forming a contact hole leading to said hillock; and
    forming on said second insulation film a second metal a second metal layer extending into said contact hole and contacting said hillock,
    wherein said step of forming a hillock comprises the steps of forming a hillock-suppressing film having a hillock-suppressing function on said first metal layer, forming a hole in said hillock-suppressing film, and thermally treating said first metal layer to form a hillock of said first metal layer, which extends into said hole formed in said hillock-suppressing film.

2. A method of manufacturing a semiconductor device according to claim 1, in which said first metal layer is made of aluminum.

3. A method of manufacturing a semiconductor device according to claim 1, in which said first metal layer is made of an aluminum alloy.

4. A method of manufacturing a semiconductor device according to claim 1, in which said hillock-suppressing film is made of metal.

5. A method of manufacturing a semiconductor device according to claim 1, in which said hillock-suppressing film is made of a metal compound.

6. A method of manufacturing a semiconductor device according to claim 1, in which said hillock-suppressing film is made of a silicon compound.

7. A method of manufacturing a semiconductor device comprising the steps of:

preparing a semiconductor substrate on which a first insulation film is formed;

forming a first metal layer on said first insulation film;

forming on said first metal layer a second insulation film having a hillock-suppressing function;

forming a third insulation film on said second insulation film;

forming a hole in said second and third insulation films;

forming a hillock of said first metal layer, which extends into said hole formed in said second and third insulation films, by thermally heating said first metal layer; and forming on said third insulation film a second metal layer extending into said hole and contacting said hillock.

8. A method of manufacturing a semiconductor device according to claim 7, in which said first metal layer is made of aluminum.

9. A method of manufacturing a semiconductor device according to claim 7, in which said first metal layer is made of an aluminum alloy.

10. A method of manufacturing a semiconductor device according to claim 7, in which said second insulation film is formed at a temperature of substantially lower than 300° C.

11. A method of manufacturing a semiconductor device according to claim 7, in which said second insulation film is made of a silicon oxide film having a thickness of substantially larger than 0.05 μm.

12. A method of manufacturing a semiconductor device according to claim 7, in which said second insulation film is made of a silicon nitride film having a thickness of substantially larger than 0.05 μm.

13. A method of manufacturing a semiconductor device according to claim 7, in which said second insulation film is made of a metal oxide film having a thickness of substantially larger than 0.05 μm.

* * * * *